United States Patent
Joshi

(10) Patent No.: US 6,943,105 B2
(45) Date of Patent: Sep. 13, 2005

(54) SOFT METAL CONDUCTOR AND METHOD OF MAKING

(75) Inventor: Rajiv Vasant Joshi, Yorktown Heights, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/782,808

(22) Filed: Feb. 23, 2004

(65) Prior Publication Data

US 2004/0180541 A1 Sep. 16, 2004

Related U.S. Application Data

(63) Continuation of application No. 10/052,451, filed on Jan. 18, 2002, now abandoned.

(51) Int. Cl.$^7$ ............................................ H01L 21/4763
(52) U.S. Cl. .................... 438/622; 438/625; 438/627; 438/631; 438/643
(58) Field of Search ................................ 438/618, 622, 438/625, 626, 627, 631, 633, 642, 643, 645, 660

(56) References Cited

U.S. PATENT DOCUMENTS

| | | | |
|---|---|---|---|
| 5,084,412 A | 1/1992 | Nakasaki | |
| 5,262,354 A | 11/1993 | Cote et al. | |
| 5,281,854 A | 1/1994 | Wong | |
| 5,345,108 A | 9/1994 | Kikkawa | |
| 5,356,836 A | 10/1994 | Chen et al. | |
| 5,373,192 A | 12/1994 | Eguchi | |
| 5,399,890 A | 3/1995 | Okada et al. | |
| 5,442,235 A | 8/1995 | Parrillo et al. | |
| 5,523,259 A | * 6/1996 | Merchant et al. | 438/643 |
| 5,534,463 A | 7/1996 | Lee et al. | |
| 5,565,707 A | 10/1996 | Colgan et al. | |
| 5,709,958 A | 1/1998 | Toyoda et al. | |
| 5,973,400 A | 10/1999 | Murakami et al. | |
| 6,030,895 A | 2/2000 | Joshi et al. | |
| 6,090,701 A | 7/2000 | Hasunuma et al. | |
| 6,285,082 B1 | 9/2001 | Joshi et al. | |

FOREIGN PATENT DOCUMENTS

| | | |
|---|---|---|
| JP | 7-340833 | 10/1924 |
| JP | 4-284627 | 10/1992 |
| JP | 4-293232 | 10/1992 |
| JP | 4-363024 | 12/1992 |
| JP | 6-140393 | 5/1994 |
| JP | 6-216133 | 8/1994 |
| JP | 6-216260 | 8/1994 |
| JP | 6-349833 | 12/1994 |
| JP | 8-255836 | 10/1996 |

* cited by examiner

Primary Examiner—Kevin M. Picardat
(74) Attorney, Agent, or Firm—Connolly, Bove, Lodge & Hutz, LLP; Robert M. Trepp

(57) ABSTRACT

A soft metal conductor for use in a semiconductor device which has an uppermost layer consisting of grains having grain sizes sufficiently large so as to provide a substantially scratch-free surface upon polishing in a subsequent polishing step. The invention also provides a method for making a soft metal conductor that has a substantially scratch-free surface upon polishing by a multi-step deposition process, i.e., first sputtering at a higher temperature and then sputtering at a lower temperature and followed by another high temperature sputtering process. The invention further discloses a method for forming a substantially scratch-free surface on a soft metal conductor by first depositing a soft metal layer at a low deposition temperature and then annealing the soft metal layer at a higher temperature to increase the grain size of the metal. The invention also discloses a dual-step deposition method for making a soft metal conductor for use in an electronic device by first depositing a first layer of metal by a physical vapor deposition technique to a first thickness, and then depositing a second layer of metal on top of the first layer of metal to a second thickness larger than the first thickness by a method of chemical vapor deposition, electroplating or electroless plating. The first deposition process may further be conducted by a chemical vapor deposition technique, with the second deposition process conducted by a physical vapor deposition technique.

18 Claims, 4 Drawing Sheets

SOFT METAL CONDUCTOR AND METHOD OF MAKING

CROSS REFERENCE TO RELATED APPLICATION

This is a continuation of U.S. patent application Ser. No. 10/052,451 filed Jan. 18, 2002 now abandoned.

FIELD OF THE INVENTION

The present invention generally relates to a soft metal conductor for use in a semiconductor device and a method of making such conductor and more particularly, relates to a soft metal conductor that has improved wear resistance in its surface layer for use in a semiconductor device wherein the surface layer consists of metal grains having grain sizes sufficiently large so as to provide a substantially scratch-free surface upon polishing in a subsequent chemical mechanical polishing step and a dual-step deposition method for making such conductor.

BACKGROUND OF THE INVENTION

Metal films have been utilized in semiconductor manufacturing to electrically connect together various components formed on a semiconductor wafer. For instance, vias, interconnects, trenches are just a few examples of such applications. Elemental aluminum and its alloys such as aluminum-copper have been used traditionally for these applications. The advantages of using aluminum and its alloys include the low resistivity, the superior adhesion to $SiO_2$, the ease of patterning, the high purity and low cost of the materials.

Aluminum and aluminum alloys are not without drawbacks when utilized in semiconductor technology. Two of these drawbacks are the softness of the materials which results in difficulty in polishing and the electromigration phenomenon which results in circuit failure. For instance, the polishing problem has been observed in a process where metal films or metal conductive lines are formed in a damascene process by first filling troughs previously etched in an insulator with a metal and then polishing away metal deposited between the troughs. When a soft metal is used, i.e., aluminum, copper or aluminum-copper alloy, the surface of the metal lines may become scratched in a polishing process. The formation of defects during polishing of scratches, pockets, depressions or erosions in the metal surface significantly increases the line resistance and thus reduces the yield of the semiconductor manufacturing process.

In order to avoid these defects produced in the polishing process of soft metals, capping by hard layers has been tried by others to improve the wear resistance of the surface layer of the metal. However, this is achieved at the expense of higher capacitance as the line thickness increases. It is inherently difficult to improve the wear resistance of soft metals which requires the processing steps of polishing. Poor polishing results in variations in the line or via resistance.

It is therefore an object of the present invention to provide a soft metal conductor that has improved wear resistance in its uppermost surface and a method of making the same without the shortcomings of the prior art conductors and the prior art methods.

It is another object of the present invention to provide a soft metal conductor that has improved wear resistance in its uppermost surface such that a substantially scratch-free surface can be obtained after polishing in a chemical mechanical polishing process.

It is a further object of the present invention to provide a soft metal conductor that has improved wear resistance in its uppermost surface by simply modifying the processing conditions of the deposition process for the soft metal.

It is yet another object of the present invention to provide a soft metal conductor that has a substantially scratch-free surface upon polishing by depositing a soft metal layer consisting of metal grains having large grain sizes in its uppermost layer.

It is another further object of the present invention to provide an electrically conducting soft metal structure that has a substantially scratch-free surface upon polishing by depositing in the uppermost layer of said structure grains of soft metal not smaller than about 200 nm.

It is still another object of the present invention to provide an electrically conducting soft metal structure that has a substantially scratch-free surface upon polishing for use in a semiconductor device by depositing in the uppermost layer of said structure metal grains having grain sizes not smaller than about 20% of the thickness of the soft metal structure.

It is still another further object of the present invention to provide an electrically conducting soft metal structure that has a substantially scratch-free surface upon polishing for use in a semiconductor device wherein the surface has a layer of at least about 100 nm in thickness of large grain size metal grains deposited therein.

It is yet another further object of the present invention to provide a method of making a soft meal conductor that has a substantially scratch-free surface upon polishing for use in a semiconductor device by a physical vapor deposition technique, a chemical vapor deposition technique or a dual-step deposition technique.

SUMMARY OF THE INVENTION

During chem-mech polishing (CMP), overall wear resistance is important. Wear could be due to the combination of chemical and mechanical action and the contribution of each is difficult to separate. It has been experimentally observed in by the inventors that the large grains during the high temperature deposition process or thermal annealing or combination of low temperature deposition followed by high temperature annealing or deposition improves wear resistance. These facts can be technically explained as follows:

A. During CMP, "wear" mechanisms can be attributed to chemical wear in combination with adhesion, abrasion and delamination wear. It appears that these components attack the large grains differently.

For mechanical component strength, adhesion (if loose debris are formed they can scratch the metallic layers), hardness etc. are important. For chemical component etchability in the chemical solution, slurry composition (pH), microstructure, etc., play a role in metal removal. Other parameters such as polishing pressure, speed, and pad structure play a significant role. Keeping other parameters constant, large grains with minimal defects may resist overall wear better than the small grains. It can be deduced that the ratio of atoms on the grain boundary and atoms in the grain itself=$2\times10^{-3}/(xd)$, where x is lattice spacing and d is grain size in microns, assuming a square grain). Thus the larger the grain size smaller is the fraction of atoms on the grain boundary for constant x. Also, smaller grains (having larger surface of grain boundaries) are prone to chemical attack during CMP. Once the grain are loose they can be easily knocked down due to mechanical action during CMP.

These debris can scratch the metal. Thus it is possible that small grains can wear faster than large grains. Experimental results support this statement.

In addition, small grains when annealed to form large grains or large grains formed at high temperature deposition process reduces the free volume or defect structure changing the grain boundary (free volume or defects are susceptible to chemical attack). The reduction of these defects during grain growth may improve resistance to chemical attack at the grain boundaries and also improve wear related to adhesion.

B. If impurities are added in the film they would segregate at grain boundaries during grain growth. In the case of alloys (e.g Al—Cu), intermetallic would form at the grain boundaries. These impurities or intermetallic can prevent attack at the grain boundaries or improve wear resistance during CMP. Impurities which impart sufficient wear resistance would be beneficial from the point of view of CMP. In short large grains formed by thermal annealing or high temperature deposition or combination, etc., would improve wear resistance (also improvement of adhesion, less debris during polishing and scratching) based on the reasons given above.

In accordance with the present invention, a soft metal conductor that has a substantially scratch-free uppermost surface upon polishing for use in a semiconductor device and a method of making the same is provided.

In the preferred embodiment, the soft metal conductor is provided by depositing an uppermost layer of the conductor consisting of grains having grain sizes not smaller than about 20% of the thickness of the soft metal conductor. This is achieved by, for instance, depositing an uppermost layer of the soft metal material to a thickness of not less than 100 nm with grains of soft metal not less than 200 nm in grain sizes. The large grains provide a significantly improved wear resistance in the uppermost layer of the soft metal conductor such that a substantially scratch-free surface upon polishing in a subsequent chemical mechanical polishing process is obtained. By substantially scratch-free, it is meant that a surface is obtained after polishing that has less than five scratches per square centimeter area.

In an alternate embodiment, a layer of soft metal having smaller grains, i.e. a grain size of not larger than 50 nm is first deposited in the soft metal conductor to a thickness of not less than 600 nm, an uppermost layer of large grains having grain sizes not smaller than 200 nm is then deposited on top of the layer of small grains. The large grain size in the uppermost layer provides the desirable scratch-free surface for polishing, while the middle layer of soft metal in small grains provides a layer of material without the thermal voiding problem.

In another alternate embodiment, a layer of soft metal having small grains of less than 50 nm in size is sandwiched between a bottom layer and a top layer of metal consisting of grains of larger than 200 nm in size.

In yet another alternate embodiment, after a large grain soft metal M1 is deposited, a layer of Ti (or Ti/TiN) is sequentially deposited on top of the soft metal. The Ti layer (or Ti/TiN) deposited at the interface between the via and M1, M2 has a thickness of not higher than 30 nm so as to provide improved anti-electromigration property in the soft metal conductor after the Ti layer is converted to a $TiAl_3$ layer in a subsequently conducted annealing process at 400° C. M1, M2 are metal stacks of Ti/Al—Cu/Ti/TiN.

The present invention is also directed to a method of making a soft metal conductor that has a substantially scratch-free surface upon polishing by a multi-step deposition process, i.e., first sputtering at 450° C. for 10–15 sec, then at 400° C. for 2 min and followed by 450° C. for 15–20 sec. A soft metal conductor that has improved wear resistance in its uppermost surface can be obtained.

The present invention is further directed to a method of forming a substantially scratch-free surface on a soft metal conductor by first depositing a soft metal layer at a low deposition temperature and then annealing the soft metal layer at a higher temperature to increase the grain size of the metal.

The present invention is further directed to a method for making a soft metal conductor for use in an electronic device that can be carried out by the steps of first depositing a first layer of metal by a physical vapor deposition technique to a first thickness, and then depositing a second layer of metal on top of the first layer of metal to a second thickness larger than the first thickness by a method such as chemical vapor deposition, electroplating or electroless plating. The first and the second metal layer can be deposited of a metal such as Al, Cu, Ag, AlCu, CuAg, AlAg and AlCuAg. The second metal layer deposited has an average grain size of not smaller than 0.3 $\mu$m. The first thickness of the first layer of metal is at least 200 nm (nominal 100 nm), while the second thickness of the second layer of metal is at least 300 nm. The second layer of metal can be deposited by a chemical vapor deposition technique at a reaction temperature of not less than 300° C. The first layer of metal can be deposited by a physical vapor deposition technique that includes large grain copper alloyed with an element such as C, B, N, or elements selected from Group IIIA, IVA and VA for improved wear and electromigration resistance. The second layer of metal deposited has a sheet resistance of not higher than 0.1 $\Omega/\square$.

The present invention is further directed to a dual-step deposition method for making a soft metal conductor for use in an electronic device that includes the steps of first depositing a first layer of metal by a chemical vapor deposition technique to a first thickness, and then depositing a second layer of metal by a technique such as electroplating, electroless plating or high temperature physical vapor deposition to a second thickness. The first metal layer deposited has an average grain size of not smaller than 0.1 $\mu$m. The first layer of metal can be deposited by a chemical vapor deposition technique resulting in a sheet resistance not higher than 0.1 $\Omega/\square$.

The present invention is still further directed to a method for forming an interconnect in a logic or memory device by at least two levels of metal which can be carried out by the operating steps of first depositing at least one layer of metal into a line or via hole of Cu, Ag, Al and binary and ternary alloys thereof, and then depositing a final layer of Cu which has an average grain size of not smaller than 0.3 $\mu$m on top of the at least one layer of metal into the line or via hole. The at least one layer of metal may include two layers of metal deposited into a line or via hole. The final layer of Cu has a sheet resistance of not more than 0.1 $\Omega/\square$.

The present invention is further directed to a method for forming an interconnect structure that is surrounded at least on 3 sides by an amorphous barrier layer which can be carried out by the steps of first depositing an amorphous barrier layer of refractory metal nitride or carbide into a line or via hole by a vapor deposition technique, and then depositing a layer of a conductive metal which has an average grain size of not smaller than 0.3 $\mu$m on top of the amorphous barrier layer to fill the liner or via hole. The amorphous barriers includes refractory metal in the refractory metal nitride barriers or carbides or borides of W, Ta or Ti alloyed with Si. The conductive metal can be deposited at a temperature between about 300° C. and about 400° C. The refractory metal nitride can be deposited by a sputtering technique by using a composite target of metal and silicon in nitrogen ambient. The method may further include the step of annealing the amorphous barrier layer at a temperature of not lower than 400° C. for at least a half hour prior to the conductive metal deposition step. The method may further include embedding the interconnect structure formed by the amorphous barrier layer and the conductive metal. The hard dielectric layer may be deposited of a material of either a fluorinated oxide or a fluorinated nitride.

BRIEF DESCRIPTION OF THE DRAWINGS

Other objects, features and advantages of the present invention will become apparent upon consideration of the specification and the appended drawings, in which.

DETAILED DESCRIPTION OF THE PREFERRED AND ALTERNATE EMBODIMENTS

The present invention provides an improves soft metal conductor for use in semiconductor devices that has a composite large/small grain structure with a greatly improved polishing capability. It is known that soft metals are susceptible to scratching or erosion when subjected to polishing. By increasing the grain size in the surface layer of the metal, the wear resistance of the soft metal is greatly improved. The improvement in wear resistance is by a factor of at least 4 to 5 compared to a standard structure.

Multi-layered structure can be achieved by a sputtering deposition process. For instance, a first layer is deposited at a high temperature for less than 30 sec, followed by a low temperature to fill the bulk of the lines or vias and finally, a deposition at a high temperature for less than 30 sec.

A structure and a method are disclosed to improve the wear resistance of soft, low resistivity metals such as aluminum, aluminum-copper, copper, etc. The method achieves a multi-layered grain structure in one deposition cycle. The sequence of the layering can be as follows: (1) large grains, (2) small grains, and (3) large grains. The bottom and the top layers act as polishing stops, while the middle layer deposited at low temperature helps prevent thermal voiding. Since the material is homogeneous, there is no loss of resistance. The structure is achieved in one deposition cycle, i.e., depositing at high temperature for a thickness of 100–200 nm, then depositing 700–800 nm thickness at low temperature and low pressure, and finally depositing a thickness of 100–200 nm at high temperature. The deposition time and temperature can be adjusted so that the thermal budget is well below the voiding temperature. The multi-layered grain structure can also be achieved by the rapid thermal annealing (RTA) of these layers. For instance, smaller grains formed at about 100–300° C. may be annealed at 400° C. for a length of time sufficient to grow the small grains into grains larger than 200 nm in grain size.

Multi-layered grain structure is created by using both PVD, CVD, electroplating or electroless plating processes and subsequent annealing techniques in dual and single damascene/reactive ion etching (RIE) structures according to a prescribed relationship for chemical mechanical polishing. The following are examples of various structures and the associated experimental processes.

Homogenous large grain structure can be created by the deposition technique described in this invention, e.g., by CVD, PVD, electroplating, electroless plating, combination of these processes etc., as well as dual deposition techniques discussed earlier.

EXAMPLE 1

Figure 1:
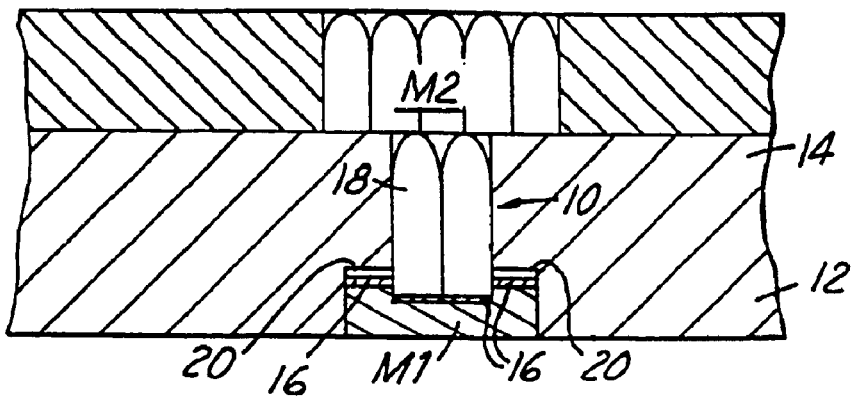
FIG. 1 is a graph illustrating a present invention soft metal conductor in a dual damascene structure as deposited.

Example 1 illustrates the formation of a dual damascene via structure by the present invention method. A dry etch method, reactive ion etching (RIE) is first used to clean the interface before an aluminum-copper deposition. As shown in FIG. 1, a via structure 10 is formed on top of already reactively ion etched layer of Ti/Al—Cu/Ti shown as M1 in FIG. 1. An oxide layer 12 or any other low dielectric constant inorganic or organic layer is deposited and planarized by chemical mechanical polishing by using colloidal silica. Additional oxide 14 is deposited and then patterned for the lines and vias. The lines are then opened up by using the RIE technique. The RIE technique is an important step used to remove all non-Al—Cu layers on top of the already formed M1 layer. A PVD process is then used to deposit a layer 16 of Ti of less than 30 nm, a layer 20 of TiN, a layer 18 of Al—Cu, and a final layer of Ti/FiN sequentially. The Al—Cu layer deposition is achieved by producing metal grains having grain sizes of at least about 20% of the thickness of the soft metal layer. The structure is then chemically polished using slurry containing silica particles and low pressure to form interconnects and vias in one step.

Figure 2:
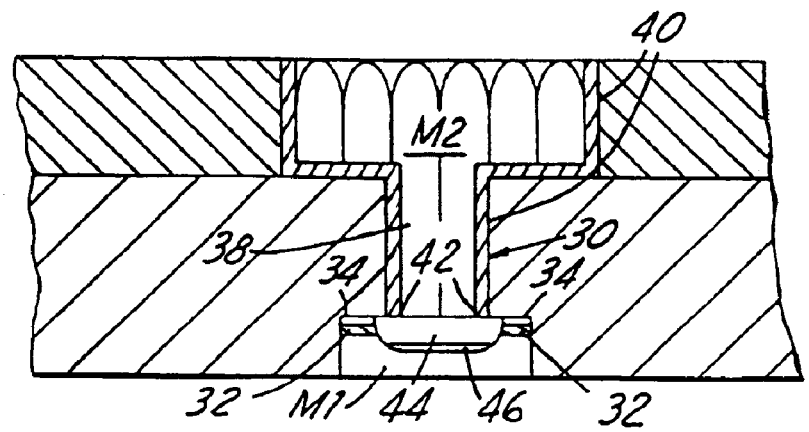
FIG. 2 is a graph illustrating the present invention soft metal conductor in a final dual damascene structure with the formation of $TiAl_3$ or a hard dielectric layer at the interface.

A second method of using a wet etch method to clean the interface before the Al—Cu deposition for a dual damascene structure is shown in FIG. 2. In this via structure 30, buffered HF (10:1) is first used to clean the Ti/TiN layers 32 and 34 on top of the M1 layer. $H_2O_2$ based wet etch may also be used to clean the via and create an encroached structure. As a result, an encroached structure with the Ti layer 32 forming a $TiAl_3$ layer during subsequent annealing at 400° C. for 30 min is achieved. It should be noted that at the shoulder portions 42 of the wet etched area 44 in the M1 layer, the layer of Ti deposited is very thin and in some instances, almost non-existent. After depositing a second Ti/Al—Cu/Ti, or Ti/TiN/AlCu/Ti layer 38, the Ti layer 40 (which subsequently forms $TiAl_3$ after 400° C. annealing) is only under the via and does not encroach as shown in FIG. 2. The remaining processing steps for the Al—Cu deposition is the same as the example described above by using the dry etch method. The thickness of $TiAl_3$ layer 32 formed is between about 30 and about 60 nm except the area 46 directly under the via which is less than 30 nm.

EXAMPLE 2

Figure 3:
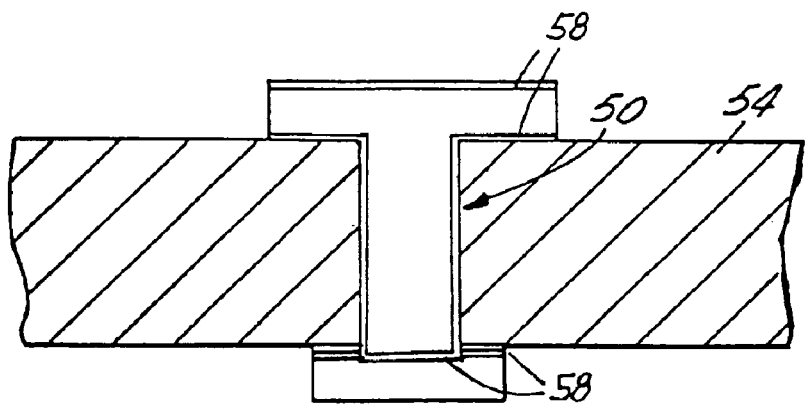
FIG. 3 is a graph illustrating the present invention soft metal conductor in a single damascene structure as deposited.
Figure 4:
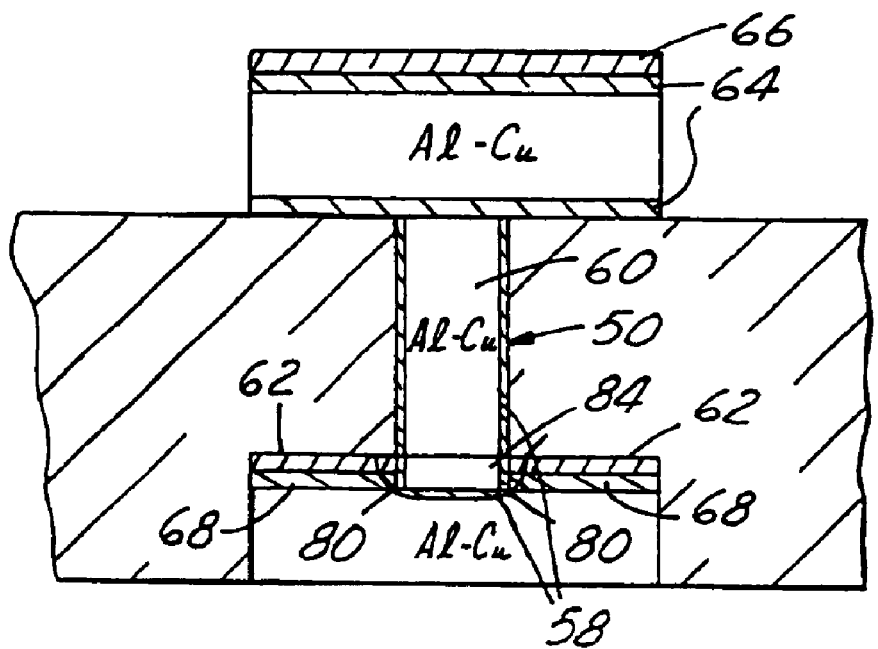
FIG. 4 is a graph illustrating a present invention soft metal conductor in a single damascene structure with the deposition of Ti and TiN layers at the interface.

A single damascene structure may by utilizing a dry etch RIE technique to clean the interface before the Al—Cu deposition is shown in FIG. 3. The via structure 50 is formed on top of already reactively ion etched M1 layer of Ti/Al—Cu/Ti. An oxide or other low dielectric constant inorganic or organic layer 54 is deposited and planarized by chemical mechanical polishing using colloidal silica. The oxide layer 54 is patterned for via 50. A first via is opened up using the RIE technique. An important step is to use RIE to remove all non-Al—Cu layers on top of the already formed M1 layer. A PVD process is then used to form a first Ti layer (or Ti/TiN sandwich layer) 58 generally of a thickness of less than 30 nm and Ti layer 68 generally of a thickness between about 20 nm and about 30 nm, and then a layer 60 of Al—Cu. This is shown in FIG. 4. The Ti layers 58 and 68 subsequently forms $TiAl_3$ after annealing at 400° C. The Al—Cu layer deposition process is conducted resulting in a layer having grain sizes of at least about 20% of the thickness of the soft metal layer deposited. The via structure 50 is then chemically polished using a slurry loaded with silica particles and low polishing pressures. A layer M2 is then deposited with a very thin Ti layer 64, i.e., less than 30 nm underneath, then patterned and reactively ion etched to form the interconnect structure. The top Ti layer 64 can be thicker than the bottom Ti layer 58. Layers 62 and 66 of TiN are formed as anti-reflective coatings for the photomasking process.

It should be noted at the shoulder portions 80 of the wet etched cavity 84, the Ti film is very thin or almost non-existent. A continuous aluminum phase therefore exists at the shoulder portions 80. This further promotes the anti-electromigration characteristics of the present invention soft metal conductor.

Figure 5:
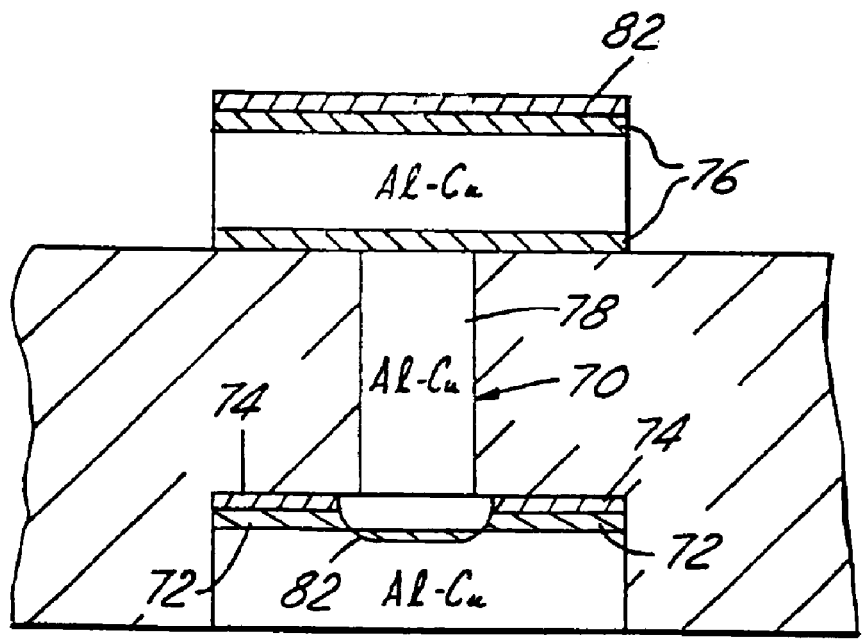
FIG. 5 is a graph illustrating a present invention soft metal conductor in a final single damascene structure with the formation of $TiAl_3$ at the interface.

A second method of forming a single damascene is the use of wet etch technique to clean the interface before the Al—Cu deposition. In the via structure 70 as shown in FIG. 5, buffered HF. (50:1) is used to clean layers 72 and 74 of Ti and TiN on top of layer M1. As a result, an encroached structure was formed. After depositing layer 78 of Ti/Al—Cu/Ti, the Ti layer 82 (which subsequently forms $TiAl_3$ after annealing at 400° C. for 30 min) is only under the via and does not encroach to other areas as shown in FIG. 5. The remaining process for Al—Cu deposition is the same as described above in the dry etch method for single damascene. The encroachment allows the easy flux of Al—Cu under an electric field and thus improving the electromigration resistance of the structure.

The structures shown in FIGS. 1–5 were tested for electromigration resistance. To evaluate the electromigration characteristics of the two level structures, 1.4-$\mu$m in diameter were fabricated. Electromigration tests were carried out at a current density of 1.22 $MA/cm^2$. A 20% resistance shift is used as a criterion for failure. The two level Al—Cu line/via structure was compared to a CVD formed W via/Al—Cu line structure. The mean time to failure for Al—Cu vias showed at least an order of magnitude of improvement over the mean time to failure for the CVD formed W stud.

A series of tests was conducted to verify the improvement in wear resistance of the soft metal conductors. For instance, aluminum and copper were deposited to create large grain structures using a sputtering process and the data obtained are shown in Table 1.

TABLE 1

| Sputtering Pressure mT | Target to work Distance cm | Grain Size $\mu$m | Yield* % | Sheet Resistance $\Omega/\square$ |
|---|---|---|---|---|
| 0.2 | 15 | 1.0 | 92 | 0/035 |
| 0.3 | 15 | 0.8 | 95 | 0.032 |
| 0.8 | 20 | 0.7 | 90 | 0.033 |
| 1.0 | 30 | 0.7 | 93 | 0.034 |

As shown in Table 1, large metal grains can be created by using short throw song throw sputtering techniques. As a result, the yield increases dramatically while maintaining the sheet resistance.

It should be noted that in Table 1, the substrate temperature during the test was maintained at 30° C. In all cases, Al—Cu film thickness was kept at between 1 to 1.5 $\mu$m. The same tests were repeated for copper with similar results obtained. For the yield analysis, a comb-serpentine structure was used with a total line length of 50 cm. The sheet resistance data were measured on 50 sites per wafer. The aspect ratio of the vias filled is 3.

When the temperature of the deposition process is changed by in-situ or separate heating (by RTA or reflow process), the grain size can be further improved to achieve the wear/scratch resistance. These data are shown in Tables 2 and 3.

TABLE 2

| Sputtering Pressure mT | Target to work Distance cm | Grain Size $\mu$m | Yield* % | Sheet Resistance $\Omega/\square$ |
|---|---|---|---|---|
| 0.2 | 15 | 2.4 | 90 | 0.034 |
| 0.3 | 15 | 2.2 | 93 | 0.034 |
| 0.8 | 20 | 1.9 | 92 | 0.033 |
| 1.0 | 30 | 1.8 | 96 | 0.032 |
| 2.0 | 30 | 1.8 | 93 | 0.033 |

For Table 2, the substrate temperature during the tests is maintained at between 400–475° C. The yield analysis data is obtained by a comb-serpentine structure with a total line length of 50 cm. The average sheet resistance was measured based on 50 sites per wafer. The aspect ratio filled is 4.

TABLE 3

| Sputtering Pressure mT | Target to work Distance cm | Grain Size $\mu$m | Yield* % | Sheet Resistance $\Omega/\square$ |
|---|---|---|---|---|
| 0.8 | 15 | 2.9 | 89 | 0.035 |
| 1.0 | 15 | 2.7 | 94 | 0.034 |
| 2.0 | 15 | 2.4 | 87 | 0.034 |
| 3.0 | 15 | 2.8 | 87 | 0.034 |

The substrate temperature of samples shown in Table 3 are maintained at between 475–550° C. The yield analysis data were obtained by a comb-serpentine structure with a total line length of 50 cm. The average sheet resistance was measured based on 50 sites per wafer. The aspect ratio filled is 2.

It was discovered that when samples are heated up to the melting temperature or when converting the surface layer to large grains by using the rapid thermal annealing (RTA) technique, the wear/scratch resistance of the samples can be further improved. These data are shown in Table 4.

TABLE 4

| Sputtering Pressure mT | Target to work Distance cm | Grain Size μm | Yield* % | Sheet Resistance Ω/□ |
|---|---|---|---|---|
| 1.0 | 15 | 3.2 | 96 | 0.033 |
| 2.0 | 15 | 3.3 | 90 | 0.033 |
| 3.0 | 15 | 3.4 | 96 | 0.034 |

As shown in Table 4, the films are deposited at three different pressures around 100° C. and then heated in a furnace at 580° C. for five minutes to fill metal into the contacts/trenches. In a separate experiment, the films were heated by using RTA technique at 600° C. for two minutes. The yield analysis data are obtained by a comb serpentine structure with a total line length of 50 cm. An average sheet resistance is measured based on 50 sites per wafer. The aspect ratio filled is 2.

Deposition/annealing processes are also used for metals such as Al—Cu and Cu. First, metal is deposited at temperatures about 100–300° C. to fill high aspect ratio vias (i.e., 2 to 3). They are then heated to temperatures about 400° C. to increase the grain size. A polishing process is then performed to verify the increase in resistance to scratching.

Other deposition techniques, such as evaporation, collimation and CVD have also been used in the deposition of Al—Cu and Cu with similarly desirable results achieved.

All polishing experiments were carried out by using particles having various hardness in the slurry, e.g., $Al_2O_3$, silica and silicon nitride. The polishing processes were carried out by using a prescribed relationship to polish soft layers such as Al—Cu and Cu.

$$\frac{dV}{dt} = \frac{KAR_{pd}H_pV_cG_p}{H_mG_m}$$

Where p denotes particles in the slurry, m denotes soft metal, pd denotes pad and c denotes chuck or wafer holder. dV/dt is the rate at which metal volume is removed. H is the hardness, A is the area of the metal exposed, G is the grain zie, R is the roughness, K is a constant that depends on chemical bonds between particles, metal, pads and pH factor, etc., $V_g$ is the speed of the chuck.

Figure 6:
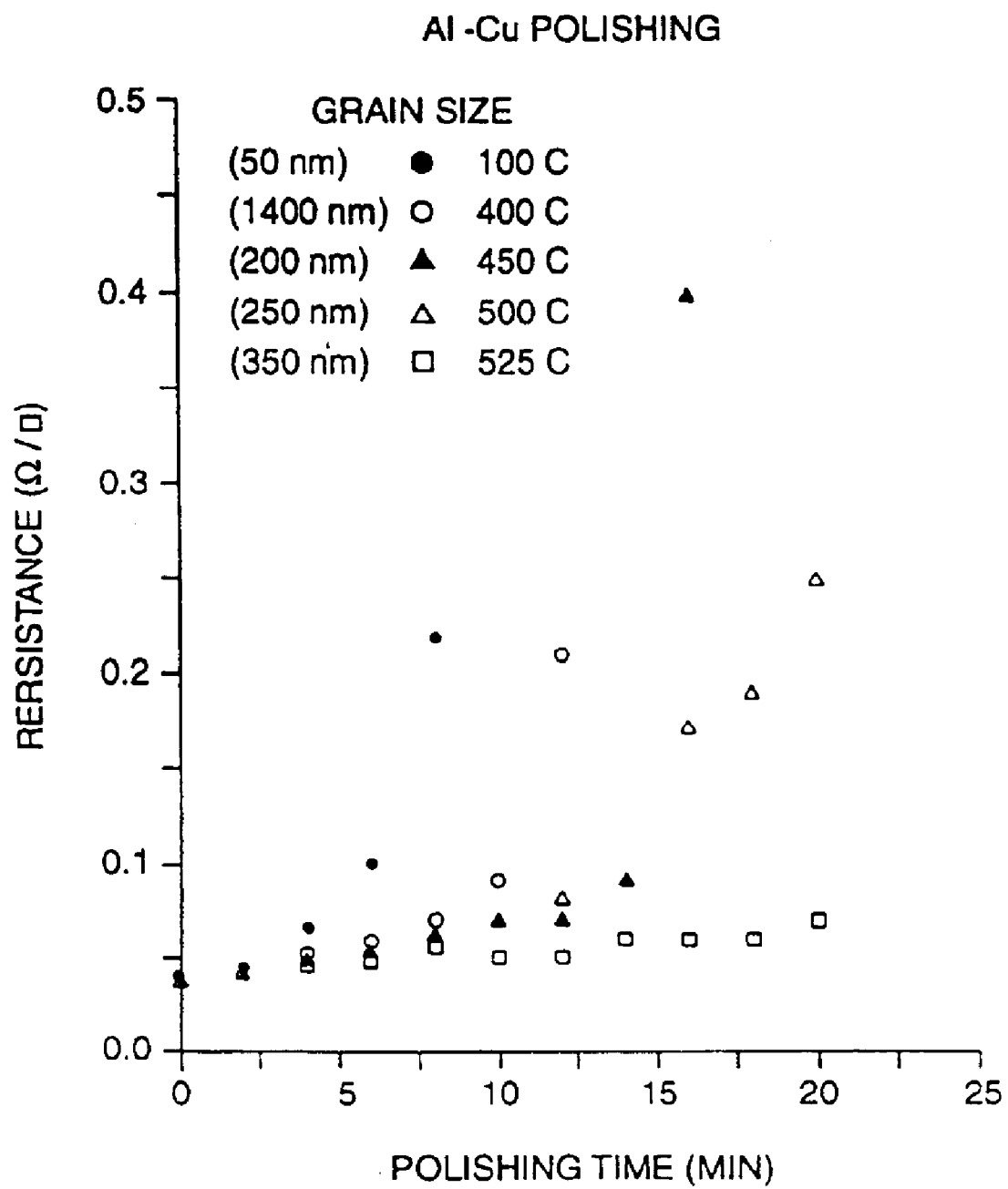
FIG. 6 is a graph illustrating the dependence of surface resistance on polishing time for surfaces having various grain sizes.

A graph of the resistance data plotted against polishing time for soft metals having various grain sizes is shown in FIG. 6. A first layer with homogeneous grain structure is created and the wear resistance is evaluated and compared against a standard Al—Cu structure. The polishing rates, as shown in FIG. 6, are obtained for structures with homogeneous grain structures. An unexpected result is obtained which shows the larger the grain size, the larger is the wear resistance of the soft metal. A combination of these multi-layered grain structure is formed and polished to form the vias.

EXAMPLE 3

In this example, soft metal is deposited by using a dual or multi-step deposition process to improve the grain size and fill. A multi-step process for depositing soft metal such as Al, Cu or Ag using PVD followed by a process which generates large grain size and is conformal (e.g., CVD Cu, electroplating or electroless plating) can be used. Table 5 shows data obtained on samples prepared by such method.

TABLE 5

| Metal | Grain Size (μm) | Yield % | Sheet rho (Ω/□) |
|---|---|---|---|
| Al—Cu | 2 | 96 | 0.038 |
| Cu | 1.5 | 98 | 0.025 |

First, a PVD layer of metal (100–200 nm) was deposited by sputtering. Then. CVD Cu (600–900 nm) was deposited on the PVD layer to improve the grain size at 350° C. using Cu hexafluoroacetylacetonato $(hfac)_2$ compounds. The thickness of the trenches vias was in the order of 1 μm and fill was close to 100%. The aspect ratio was close to 2.5–3.0. It is expected that the use of other deposition techniques such as plating or electroplating can improve the grain size as well. The present invention increases the grain size for improved wear and electromigration resistance. In addition, the first PVD layer may contain large grain Cu alloyed with carbon, boron, nitrogen and other small impurities such as group IIIA, IVA and VA from the periodic table. These alloys may further impart improved wear and electromigration behavior.

EXAMPLE 4

In another method for improving the metal grain size, a CVD layer can be deposited first and then followed by an electroplating, electroless plating or high temperature PVD process. Experiments were carried out to demonstrate such processes. Table 6 contains data showing the enlargement of metal grains and fill when the thickness of the film deposited is approximately 0.1 μm. The fill achieved was void-free for an aspect ratio between 3 and 4.

TABLE 6

| Metal | Grain Size (μm) | Yield % | Sheet rho (Ω/□) |
|---|---|---|---|
| Al—Cu | 1.5 | 90 | 0.034 |
| Cu | 1.2 | 93 | 0.025 |

EXAMPLE 5

It has been discovered that, for high performance logic and memory devices on a single chip, Cu or its alloys are the best interconnects to lower the RC delays. This includes SRAM or DRAM devices along with main processors. Experiments have been conducted to prove this concept by using a 512K SRAM device and associated high performance logic. This concept can be extended to the structure which has high performance dynamic logic circuits along with memory (a memory cell that has 6 transistor CMOS). There are three levels of metal, out of which the final level metal line and via was made of copper. The results are shown in Table 7, wherein the bit yield is based on 512K bits.

TABLE 7

| Metal | Grain Size (μm) | Yield* % | Sheet rho (Ω/□) |
|---|---|---|---|
| Al—Cu | 1.0 | 88 | 0.036 |
| Cu | 1.2 | 91 | 0.023 |

The above demonstration shows that it is possible to contend the concept to logic and main memory such that single capacitor memory structures (i.e., a DRAM cell) can be interconnected with large grain copper based alloy metallurgy.

EXAMPLE 6

Figure 7:
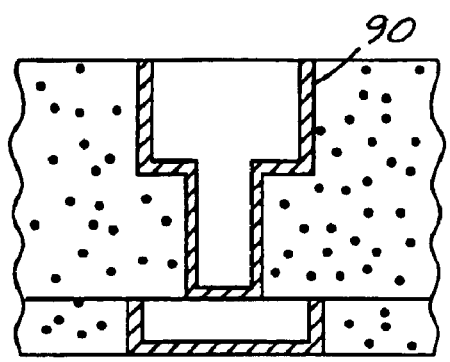
FIG. 7 is a graph illustrating a present invention soft metal conductor in a dual damascene structure that has a thin amorphous liner.

This example shows Cu and its alloys surrounded at least on three sides by thin amorphous barrier layer. As the line width decreases, the liner or barrier thickness needs to be reduced. Otherwise, the liner occupies a large cross-sectional area of the trench to be filled with metal and thereby reducing the effective area and increasing the metal resistance. To remedy the problem, a thinnest possible liner made of amorphous material, e.g., W—Si—N or Ta—Si—N may be utilized. This is shown in FIG. 7 in a dual damascene structure, and in FIG. 8 in a single damascene structure. The liner 90 may include microcrystalline nitrides or carbides of W, Ta, Ti surrounded by an amorphous $Si_3N_4$ layer. To demonstrate this embodiment, nitrides of W were chosen.

In the process, a very thin W—Si—N is first deposited by the reaction of $NH_3$, $SiH_4$ and $WF_6$ at a reaction temperature between about 300° C. and about 400° C. The resultant structure showed amorphous nitride surrounding microcrystalline W—N. The resistivities achieved were determined to be between 100–200 $\mu\Omega$-cm. The structure does not have large grain boundaries and is useful as a good diffusion barrier for copper for temperatures up to 500° C. for 1 hour. The same structure can be produced by alternating reactions of $WF_6+SiH_4$ followed by $NH_3$ reaction in-situ and repeating the reaction of $WF_6+SiH_4$ until the desired film thickness is achieved.

Similarly, other techniques such as sputtering (i.e., a collimated, low/high pressure, ionized sputtering) and composite sputtering targets (e.g., Ta—Si—N) may be used to achieve the same barrier materials. A film layer of large grain Cu is then deposited on top of the barrier material. Using the prescribed relationship for damascene, Cu can be removed from the amorphous liner. Utilizing the difference in rate for large grain Cu and small grain liner, a good selectivity in polishing between liner and Cu can be achieved. Another slurry can be used to remove the amorphous liner from the top of the dielectric.

Figure 8:
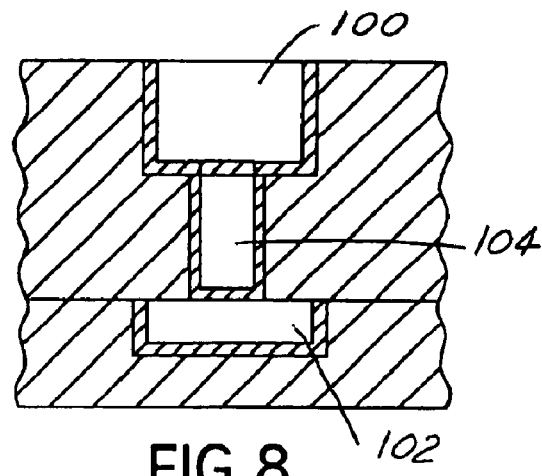
FIG. 8 is a graph illustrating a present invention soft metal conductor in a single damascene structure that has a thin amorphous liner.

Another structure using single damascene technique can be created by the present invention. This is shown in FIG. 8. In this structure, M2 level copper 100 is connected to M1 level copper 102 by a via 104 formed on two stages. First, via 104 is formed on top of M1 layer 102 metal (e.g., W, large grain Al, Ag, Cu or their alloys) can be deposited in via 104 within a diffusion barrier layer and then polished off. Then forming trenches into oxide lines on top of the via. By depositing large grain copper and then polishing off, single damascene structure can be created. The advantage here is if the aspect ratios of vias and lines increase then single damascene would help to fill such stringent topography incrementally.

EXAMPLE 7

In this example, efforts were made to further improve the performance of large grain Cu structure. A hard dielectric layer formed by a fluorinated oxide or nitride may be used in which copper lines with the liners discussed above can be formed in a dual damascene structure (see FIG. 2). In addition, other dielectric materials such as an amorphous or porous oxide treated with silane or methane can also be used to lower the dielectric constant.

While the present invention has been described in an illustrative manner, it should be understood that the terminology used is intended to be in the nature of words of description rather than of limitation.

It is to be noted that the structure disclosed in this invention, i.e. dual damascene, single damascene, or structures formed with RIE can be repeated to form multilevel interconnect structure.

Furthermore, while the present invention has been described in terms of several preferred embodiments thereof, it is to be appreciated that those skilled in the art will readily apply these teachings to other possible variations of the invention.

The embodiments of the invention in which an exclusive property or privilege are claimed are defined as follows:

1. A method for forming interconnects in logic and memory devices on a single chip wherein the interconnects have an amorphous barrier layer on at least on three sides thereof, and wherein the method comprises depositing an amorphous barrier layer of refractory metal nitride or carbide into a line or via hole by a vapor deposition technique, and depositing a layer of a conductive metal having an average grain size of not smaller than 0.3 $\mu$m on top of said amorphous barrier layer filling said line or via hole; and further comprising depositing a hard dielectric layer in which said amorphous barrier layer and said conductive metal is formed.

2. A method for forming interconnects according to claim 1, wherein said refractory metal in said refractory metal nitride or carbide is selected form the group consisting of W, Ta and Ti.

3. A method for forming interconnects according to claim 1, wherein said conductive metal is selected from the group consisting of Cu, Ag, Al CuAg, CuAl, AgAl and CuAgAl.

4. A method for forming interconnects according to claim 1, wherein said vapor deposition technique is a chemical vapor deposition technique.

5. A method for forming interconnects according to claim 1, wherein said refractoty metal nitride is deposited by a chemical vapor deposition technique conducted at a reaction temperature about 300° C. and about 400° C.

6. A method for forming interconnects according to claim 1, wherein said refractory metal nitride is deposited by a sputtering technique by using a composite target.

7. A method for forming interconnects according to claim 1 further comprising the step of annealing said amorphous barrier layer at a temperature of not lower than 400° C. for at least ½ hour prior to the conductive metal deposition step.

8. A method for forming interconnects according to claim 1 further comprising the step of depositing a seed layer of said conductive layer prior to the conductive metal deposition step.

9. A method for forming interconnects according to claim 1, wherein said hard dielectric layer is deposited of a material selected from the group consisting of fluorinated oxide and amorphous or porous oxide treated with $SiH_4$ or $CH_4$.

10. A method for forming interconnects in logic and memory devices on a single chip which comprises depositing a first layer of a soft metal containing grains having grain sizes sufficiently large so as to provide a substantially scratch-free surface upon polishing in a subsequent chemical mechanical polishing step and not less than 0.3 $\mu$m; and further comprising depositing a layer of said soft metal containing grains having a grain size of not more than 50 nm and a layer thickness of not less than 400 nm prior to said deposition process of said first layer of soft metal so as to provide a substantially scratch-free surface upon polishing in a subsequent CMP step.

11. A method according to claim 10, wherein said first soft metal layer has a thickness of at least 100 nm.

12. A method according to claim 10 further comprising the steps of sequentially depositing a layer of Ti of less than 30 nm thick and a second layer of soft metal on top of said first soft metal layer such that the anti-electromigration property of said soft metal conductor is improved when said Ti layer is converted to $TiAl_3$ layer in a subsequent annealing process.

13. A method according to claim 10, wherein said soft metal is selected from the group consisting of Al, Cu, Ag, CuAg, CuAl, AgAl, and CuAgAl.

14. The method according to claim 10 wherein said first layer of said soft metal is copper.

15. The method according to claim 10 wherein the layer thickness of the layer of said soft metal containing grains having a size of not more than 50 nm is not less than 600 nm.

16. The method according to claim 10 wherein the layer thickness of the layer of said soft metal containing grains having a size of not more than 50 nm is not less than 600 nm.

17. The method according to claim 10 which further comprises depositing said first layer and said second layer in openings located in low dielectric constant layer.

18. A method for forming interconnects in logic and memory devices on a single chip wherein the interconnects have an amorphous barrier layer on at least on three sides thereof, and wherein the method comprises depositing an amorphous barrier layer of refractory metal nitride or carbide into a line or via hole by a vapor deposition technique, and depositing a layer of a conductive metal having an average grain size of not smaller than 0.3 μm on top of said amorphous barrier layer filling said line or via hole; and further comprising providing a low-k dielectric layer in which said amorphous barrier layer and said conductive meta is formed.

* * * * *